United States Patent
Seshasayee et al.

(10) Patent No.: US 9,984,762 B1
(45) Date of Patent: May 29, 2018

(54) CASCADED E-FUSE SWITCH CIRCUITS TO CONTROL DATA BACKUP IN A STORAGE DEVICE

(71) Applicant: Seagate Technology LLC, Cupertino, CA (US)

(72) Inventors: Nikhil Seshasayee, Bangalore (IN); Keith Neil MacLean, Loveland, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days. days.

(21) Appl. No.: 15/647,803

(22) Filed: Jul. 12, 2017

Related U.S. Application Data

(60) Provisional application No. 62/459,831, filed on Feb. 16, 2017.

(51) Int. Cl.
| | |
|---|---|
| *G11C 17/18* | (2006.01) |
| *G11C 17/16* | (2006.01) |
| *G11C 29/02* | (2006.01) |
| *G11C 29/00* | (2006.01) |

(52) U.S. Cl.
CPC ........... *G11C 17/165* (2013.01); *G11C 17/18* (2013.01); *G11C 29/027* (2013.01); *G11C 29/785* (2013.01)

(58) Field of Classification Search
CPC ....... G11C 17/18; G11C 17/16; G11C 17/165; G11C 29/785; G11C 29/027
USPC .............................................. 365/225.7, 226
See application file for complete search history.

(56) References Cited

U.S. PATENT DOCUMENTS

| | | | |
|---|---|---|---|
| 7,839,689 B2 | 11/2010 | Pycon et al. | |
| 8,612,779 B2 | 12/2013 | More et al. | |
| 8,811,086 B2 | 8/2014 | Kim | |
| 9,058,834 B1 | 6/2015 | Ferris et al. | |
| 9,543,032 B2 | 1/2017 | Kang et al. | |
| 2007/0081620 A1* | 4/2007 | Beattie | H03L 7/06 375/376 |
| 2008/0280656 A1 | 11/2008 | Gonikberg et al. | |
| 2012/0218817 A1* | 8/2012 | Kang | G11C 11/5628 365/185.2 |
| 2015/0006926 A1 | 1/2015 | Hong | |

* cited by examiner

*Primary Examiner* — Son Dinh
(74) *Attorney, Agent, or Firm* — Hall Estill Attorneys at Law

(57) ABSTRACT

Apparatus for managing power in a data storage device, such as a solid state drive (SSD). In some embodiments, an energy management circuit supplies electrical power to a non-volatile memory (NVM). The energy management circuit has cascaded first and second E-Fuse switch circuits each with an input terminal and an output terminal. The second E-Fuse switch circuit receives input power from the first E-Fuse switch circuit used as a rail voltage for the device. The second E-Fuse switch circuit is configured to monitor the rail voltage, deactivate the first E-Fuse switch circuit responsive to the rail voltage falling below a predetermined threshold, and supply backup power to the device from a backup power source.

20 Claims, 2 Drawing Sheets

US 9,984,762 B1

CASCADED E-FUSE SWITCH CIRCUITS TO CONTROL DATA BACKUP IN A STORAGE DEVICE

RELATED APPLICATION

The present application makes a claim of U.S. domestic priority under 35 U.S.C. 119(e) to U.S. Provisional Patent Application No. 62/459,831 filed Feb. 16, 2017, the contents of which are hereby incorporated by reference.

SUMMARY

Various embodiments of the present disclosure are generally directed to an apparatus for managing a power flow in a data storage device, such as but not limited to a solid state drive (SSD) conforming to the M.2 Standard.

In some embodiments, a data storage device has a non-volatile memory (NVM) and an energy management circuit. The energy management circuit includes cascaded first and second E-Fuse switches each having an input terminal and an output terminal. The output terminal of the first E-Fuse switch is coupled, via a conductive path, to both the input and output terminals of the second E-Fuse switch to supply a rail voltage to the NVM. The second E-Fuse switch is configured to deactivate the first E-Fuse switch responsive to a voltage at the input terminal of the second E-Fuse switch falling below a predetermined voltage.

These and other features and advantages which may characterize various embodiments can be understood in view of the following detailed discussion and the accompanying drawings.

DETAILED DESCRIPTION

Figure 1:
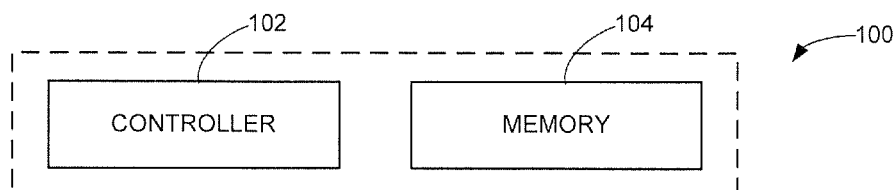
FIG. 1 provides a functional block representation of a data storage device in accordance with various embodiments of the present disclosure.

Various embodiments of the present disclosure are generally directed to power management in a data storage device.

Large-scale data storage systems generally comprise storage devices such as hard disc drives (HDDs), solid-state drives (SSDs), and hybrid data storage devices (HDSDs, also referred to as Hybrid Solid State Drives or HSSDs). HDDs generally use rotatable data recording media, such as magnetic recording discs, to store data. SSDs use solid-state semiconductor memory, such as NAND flash, to store data. Hybrid devices often employ both rotatable HDD media and SSD semiconductor memory.

The storage devices may be held in carriers which are inserted into slots in multi-device storage enclosures. The enclosures, in turn, may be mounted into racks or cabinets to provide high density data storage systems, such as but not limited to a distributed object, cloud storage environment. Each enclosure may include a number of other active components to support the operation of the storage devices such as controllers, thermal cooling mechanisms, power supply units, etc.

A commonly employed industry standard size for SSDs is referred to as the M.2 Standard (or more specifically, the PCI-SIG PCI Express M.2 Specification). Formerly referred to as the Next Generation Form Factor (NGFF), the M.2 Standard provides a substantially rectangular printed circuit board to which various memory and control integrated circuit devices are mounted. The board has an edge connector along one side with up to 67 pins and a semicircular mounting hole at the center of the opposite edge. The M.2 Standard defines board widths of nominally 12, 16, 22 and 30 mm, and board lengths of nominally 16, 26, 30, 38, 42, 60, 80 and 110 mm. A commonly employed size is the M.2 2242, which is an SSD having dimensions of nominally 22 mm by 42 mm. Another commonly employed size is the M.2 2280, with dimensions of nominally 22 mm by 80 mm.

Data storage devices tend to include power management circuitry that operates to monitor and regulate electrical power used by the various data storage device components. The electrical power is supplied from an external source to the data storage device. For example, the input power to many M.2 SSD devices is usually nominally 3.3V with about a ±5% tolerance. This generally corresponds to an input power range of from nominally 3.135V to 3.465V.

Should a loss of power condition be experienced, such as a drop in the input voltage to below this lower range, a typical enterprise class M.2 device will initiate an automatic data back-up operation to ensure that all cached data in local volatile memory have been written to the non-volatile main memory (e.g., NAND flash). A previously charged, large capacitor bank incorporated into the M.2 device may be used to supply this required backup power. The power management circuitry may perform other functions as well, such as managing the charging of the backup capacitors (such as through the use of a charge pump arrangement), ensuring that no reverse current flows back to the input voltage source during the backup operation, controlling voltage inrush during subsequent initialization, etc.

Some M.2 devices use an electronic fuse (E-Fuse) switching circuit to trigger the backup operation. As will be recognized, an E-Fuse switch circuit is a circuit device that can be electronically activated and reset to open or close a conduit pathway, and may include a power MOSFET or similar element to modulate the current flow. One issue that has been observed with some M.2 devices is that the forward voltage drop of an E-Fuse switch circuit can be excessively high, resulting in an undesired triggering of the auto back-up sequence in the data storage device at a time when the input voltage remains within an acceptable range.

Accordingly, various embodiments of the present disclosure are generally directed to enhanced power management in a data storage device, including but not limited to an M.2 Standard SSD device. As explained below, the data storage device includes an energy management circuit coupled to receive electrical power from an external source through a data storage device interface, such as an interface connector that plugs into a system backplane.

The energy (power) management circuit comprises cascaded first and second E-Fuse switch circuits, each with different forward biased voltage drops. Each of the first and second E-Fuse switch circuits has an input terminal and an output terminal. The input terminal of the first E-Fuse switch circuit is coupled to receive the input power from the external source. The output terminal of the first E-Fuse switch circuit is coupled to both the input terminal and the output terminal of the second E-Fuse switch circuit. This configuration provides a memory of the data storage device with a rail voltage (e.g., Vdd) corresponding to the voltage at the output terminal of the first E-Fuse switch circuit during normal operation. The second E-Fuse switch circuit is bypassed since the input and output terminals thereof are coupled together, but is operative to monitor a voltage level of the rail voltage At such time that the rail voltage falls below a predetermined threshold, the second E-Fuse switch circuit deactivates the first E-Fuse switch circuit to decouple the data storage device from the external power source. The second E-Fuse switch circuit asserts a power fail signal to a controller circuit to initiate a backup data sequence using backup power so that data stored locally in a volatile memory are transferred to non-volatile memory, such as NAND flash. The backup power may be supplied by a capacitor bank coupled to the second E-Fuse switch circuit, and is output on the output terminal of the second E-Fuse switch.

The second E-Fuse switch circuit establishes the predetermined threshold in relation to the amount of forward voltage drop across a switching device within the first E-Fuse switch circuit. In this way, the second E-Fuse switch circuit can decouple the first E-Fuse switch circuit from the external source and seamlessly switch in the backup power to the system during a backup mode, while not reducing the rail voltage during normal operation.

These and other features and advantages of various embodiments can be understood beginning with a review of FIG. 1, which shows a simplified functional block representation of a data storage device 100. The data storage device 100 includes a controller 102 and a memory module 104.

The controller 102 is a hardware or processor based circuit that provides top-level control of the device 100. In some embodiments, the controller 102 may be one or more programmable processors that utilize programming instructions stored in a local memory which are executed by the processor as required.

The memory module 104 includes one or more forms of non-volatile data storage memory to store user data supplied by the host device. The non-volatile data storage memory can take a variety of forms including but not limited to rotatable magnetic recording media (discs), solid state semiconductor memory (e.g., flash memory cells, STRAM, RRAM, etc.), etc. The memory module 104 can include additional elements including read/write/erase control circuitry, data buffers, memory controller circuitry, etc. configured to manage the writing and subsequent reading of data to and from the non-volatile memory. In some cases, the controller functionality can be incorporated directly into the memory module.

Figure 2:
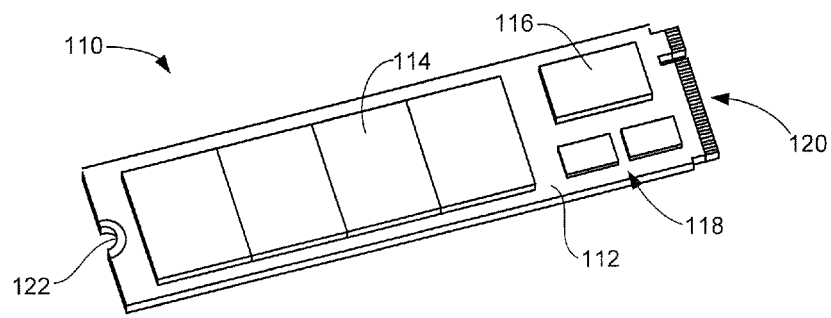
FIG. 2 is an isometric depiction of a solid state drive (SSD) data storage device corresponding to the M.2 standard in accordance with some embodiments.

FIG. 2 shows a data storage device 110 generally corresponding to the device 100 in FIG. 1. The data storage device 110 in FIG. 2 is characterized as a solid-state drive (SSD) card corresponding to the M.2 Standard as a 2280 M.2 card with nominal dimensions of 22 mm by 80 mm. Other sizes, form factors and configurations can be used as desired so FIG. 2 is merely for purposes of general illustration and is not limiting.

The exemplary SSD card 110 in FIG. 2 includes a substrate printed circuit board 112 on which is mounted a number of flash memory devices 114. In some embodiments, one or more controller circuit IC devices denoted at 116 provide local SSD control circuit functionality for the SSD card in a manner similar to the controller 102 discussed above in FIG. 1. In other embodiments, the circuits 116 may represent local volatile memory (e.g., DRAM, etc.) accessed by a separate controller. Additional support circuits utilized by the SSD 110 are generally represented at 118. An edge connector 120 is configured for mating engagement with an associated SSD card connector (not shown). A semi-circular mounting recess 122 is disposed opposite the edge connector 120.

Figure 3:
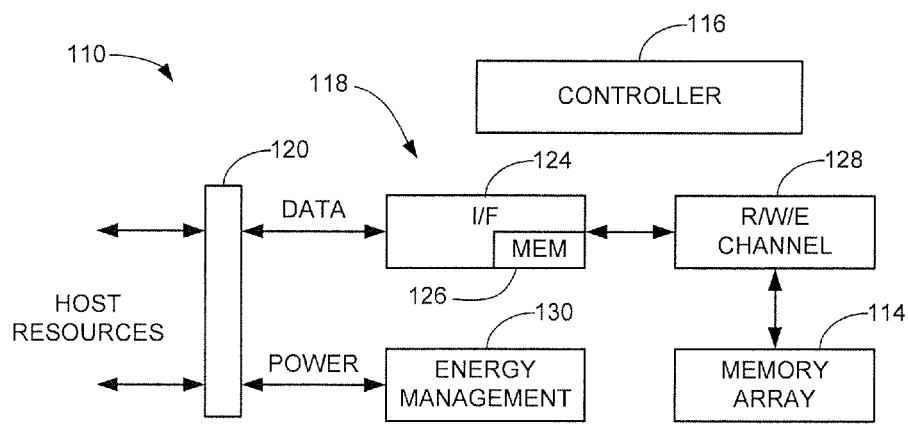
FIG. 3 is a functional block representation of the data storage of FIG. 2 in accordance with some embodiments.

FIG. 3 provides a generalized functional block representation of the SSD card 110 in FIG. 2 in accordance with some embodiments. The aforementioned NAND flash memory array 114, controller 116 and support circuitry 118 from FIG. 2 operate to process commands from a host device to transfer data to and from the array. The support circuitry 118 is shown to include an interface (I/F) circuit 124 with corresponding local volatile memory 126 (e.g., DRAM), read/write/erase (R/W/E) channel 128 and an energy management circuit 130.

Figure 4:
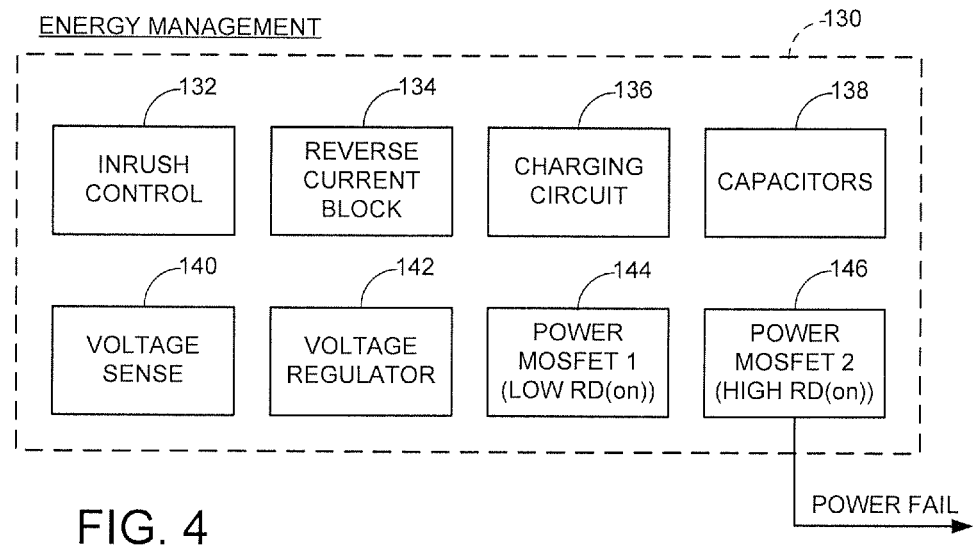
FIG. 4 is a functional block representation of an energy management circuit from FIG. 3 in accordance with some embodiments.

Of particular interest is the energy management circuit 130, a more detailed functional representation of which is shown in FIG. 4. The energy management circuit 130 operates to condition power supplied to the SSD card 110 from an external source and distribute this power in the form of various voltages to the remaining circuitry on the card. Such voltages may include nominal rail voltage values of nominally 3.3V, 2.5V, 1.8V, 1.5V, 0.9V, etc. Other values may be used.

The energy management circuit 130 further operates to initiate and manage a back-up mode of operation during which the card 110 prepares for a shutdown (deinitialization) operation. During the back-up mode, various sets of user data, metadata, state data and other control data may be transferred from volatile memory locations, such as the local memory 126, to non-volatile memory such as in the flash memory array 114. Sufficient energy is stored on the card 110 to enable this operation to be completed. The shutdown may be a controlled and intentional shutdown, such as a power shutdown initiated at the host level. The shutdown may also be the result of an inadvertent power cycling condition, a hot-swap operation in which a user physically removes the SSD card 110 from the system during operation, etc.

The external power is supplied to the energy management circuit 130, via the edge connector 120, from an external voltage source (not shown). A number of functional blocks are provided in FIG. 4 including an inrush control circuit 132, a reverse current block circuit 134, a charging circuit 136, energy storage capacitors 138, a voltage sense circuit 140, a voltage regulator 142, and first and second power switches 144, 146. The respective functions of the various circuits in FIG. 4 may be combined into one or more discrete devices, as required.

Generally, the inrush control circuit 132 reduces current and voltage spikes that may be applied to the card 110 upon initialization of the card. The reverse current block circuit 134 is operative to prevent current from flowing back across the interface 120 when the SSD card 110 is in a back-up mode. The charging circuit 136 manages the charging of the capacitors 138 to store energy for use during the back-up mode. A charge pump arrangement may be used during normal operation of the SSD card to charge the capacitors to some predetermined, relatively large value, such as about 12V.

The voltage sense circuit 140 provides voltage sensing and signals a transition to the back-up mode may be necessary based on the amount of detected input voltage at the interface 120. The voltage regulator 142 provides voltage conversion and regulation to maintain a steady Vdd voltage.

The first and second power switches 144, 146 are power switching devices, such as MOSFETs (metal oxide semiconductor field effect transistors), that can be electronically closed (placed in a conductive state) and opened (placed in a non-conductive state). It is contemplated that the first power switch 144 will be configured to have a lower forward biased operational voltage drop (low RDS(on) value) and the second power switch 146 will be configured to have a higher forward biased operational voltage drop (high RDS (on) value). Because the switches are connected in series, the voltage supplied to the second power switch 146 will be lowered by an amount corresponding to the source-drain voltage drop across the first power switch 144.

Figure 5:
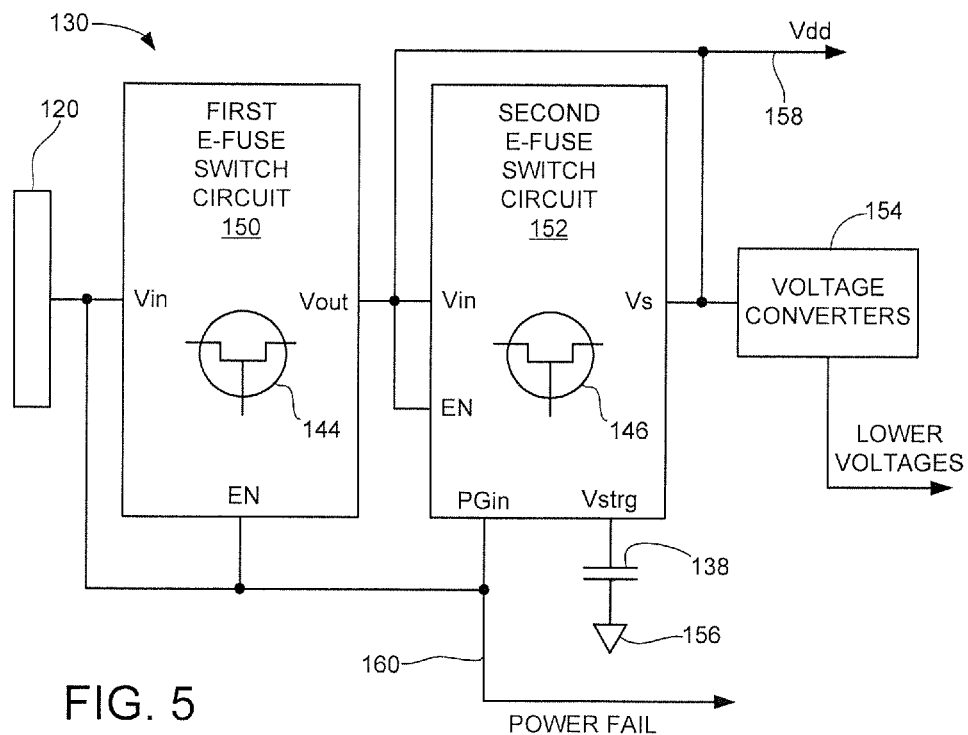
FIG. 5 shows a schematic representation of the energy management circuit in some embodiments.

FIG. 5 is a schematic depiction of an arrangement of the energy management circuit 130 of FIG. 4 in accordance with some embodiments. The circuit 130 includes a first E-Fuse switch circuit 150, a second E-Fuse switch circuit 152, and one or more downstream voltage converters 154.

The first E-Fuse switch circuit 150 is physically realized as a multi-pin integrated circuit (IC) package. Without limitation, the first E-Fuse switch circuit 150 may take the form of a Model TPS 25942A switching device or a Model TPS22953 load switch device, both commercially available from Texas Instruments, Inc. The output voltage from the first E-Fuse switch circuit 150 is supplied as an input voltage to the second E-Fuse switch circuit 152. The second E-Fuse switch circuit 152 is also physically realized as a multi-pin IC package, such as a Model MP5505A energy storage and management unit commercially available from Monolithic Power Systems, Inc. Other configurations can be used.

With reference again to FIG. 4, it is contemplated that the inrush control circuit 132, the reverse current block circuit 134 and the first power switch 144 are incorporated into the first E-Fuse switch circuit 150. The charging circuit 136, voltage sense circuit 140, the voltage regulator 142 and the second power switch 146 are incorporated into the second E-Fuse switch circuit 152. The charging circuit 136 operates as a charge pump to charge the charging capacitor 138, which is referenced to an appropriate reference plane or terminal (e.g., electrical ground) 156.

The first E-Fuse switch circuit 150 is shown to include an input voltage (Vin) pin or terminal, an output voltage (Vout) terminal, and an enable (EN) terminal. Additional inputs may be supplied to other terminals but such are omitted for purposes of clarity. For example, depending on the configuration of the circuits, external circuit elements such as resistors, capacitors, etc. may be connected to establish conditioning, rise time and/or sense settings as required for a particular application.

The Vin terminal is configured to receive the input voltage from the external source via the interface 120. It is contemplated that this value will be nominally 3.3V±5%, although other levels may be used. The Vout terminal will output this value minus the relatively small forward voltage drop through the first E-Fuse switch circuit 150. This relatively small forward voltage drop is primarily due to the low RDS (on) value of the first power MOSFET 144. The first power MOSFET 144 is generally arranged in series between the Vin and Vout terminals in such a way that transitioning the first power MOSFET from a source-drain conductive state to a source-drain non-conductive state opens the switch and drops the voltage at the Vout terminal to zero (e.g., "opens" the first E-Fuse switch circuit 150).

The second E-Fuse switch circuit 152 includes an input voltage (Vin) terminal, output voltage (Vs) terminal, enable (EN) terminal, a power good indicator (PGin) terminal, and a voltage storage (Vstrg) terminal. As before, additional terminals may be used as required. The Vin and Vs terminals of the second E-Fuse switch circuit 152 are both connected to receive the voltage from the Vout terminal of the first E-Fuse switch circuit 150. This serves to supply a nominal rail voltage from the input source (e.g., Vdd of about 3.3V) from the Vout terminal, and effectively bypasses the second E-Fuse switch circuit 152 during normal operation.

The storage capacitor(s) 138 are connected between the Vstrg terminal and the reference terminal 156 (e.g., electrical ground). The PGin terminal is connected to a power fail path 160 which, when driven to a low logic state, signals the controller circuit 116 to initiate the back-up mode of operation.

The second power MOSFET 146 is also generally connected in series between the Vin and Vs terminals internally within the circuit 152. The second power MOSFET 146 is shorted during normal operation via the external connection between Vin and Vs. A sensed power drop at the Vin terminal of the circuit 152 enables a transfer of energy from the capacitor(s), such as through a buck mode converter circuit, to path 158 via the Vs terminal.

The energy management circuit 130 in FIG. 5 operates as follows. During normal operation, as noted above the nominal input voltage is supplied via the interface connector 120 to the first E-Fuse switch circuit 150, which passes the voltage (with a small forward voltage drop) to the second E-Fuse switch circuit 152, which in turn outputs the Vdd voltage on path 158 for use by remaining portions of the SSD card 110.

At initialization, the first E-Fuse switch circuit 150 provides the inrush control function of circuit 132 (FIG. 4) so that voltage or current spikes are not sensed by the second E-Fuse switch circuit 152.

At such time that the input voltage level supplied by the interface connector 120 drops below a specified threshold, as sensed at the Vin terminal of the second E-Fuse switch circuit 152, the PGin terminal at path 160 will go low. This will disable the first E-Fuse switch circuit 150, immediately isolating the card from the rest of the system (e.g., initiating the reverse current block operation of circuit 134 in FIG. 4). At this point, the stored energy on the capacitor(s) 138 will be transferred and output at the Vs terminal, enabling the card 110 to perform the back-up mode of operation using the local energy stored on the capacitor(s) 138.

As noted above, the controller 116 will initiate the back-up mode in response to the power fail signal (line 160) transitioning low. Steps may include writing various forms of cached data (e.g., user data, map data, state data, etc.) to flash and placing various circuits in a lower powered state in anticipation of full loss of power.

Once system power is restored at the interface connector 120, the Vin and EN terminals of the first E-Fuse switch circuit 150 will sense the restored voltage, resuming operation of the first E-Fuse switch circuit. The corresponding input voltage will be provided to the Vin and EN terminals of the second E-Fuse switch circuit 152, as well as pull the PGin level high, resuming operation of the second E-Fuse switch circuit 152. This will cause the second E-Fuse switch circuit 152 to provide the supply voltage Vdd on path 158 (as well as the lower voltages from the voltage converters 154) based on the input power from the interface connector 120.

The power good threshold sensed at the Vin terminal of the second E-Fuse switch circuit 152 is set to take into account the voltage drop across the first E-Fuse switch circuit 150. For example and not by way of limitation, if the first E-Fuse switch circuit 150 provides a forward drop of about 0.15V, then the input threshold at the Vin terminal of the second E-Fuse switch circuit 152 may be set to nominally trigger at a voltage of about 2.9V. Other values can be used.

The use of cascaded E-Fuse switch circuits as exemplified herein can provide a number of benefits, including better inrush and reverse current control and more accurate voltage sensing. Connecting the input Vin and output Vs terminals together via path 158 ensures that the higher forward voltage drop through the second E-Fuse switch circuit 152, primarily established by the second power MOSEFT 146 does not adversely lower the overall voltage rail for the system (e.g., Vdd).

It will now be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A data storage device, comprising:
a non-volatile memory (NVM); and
an energy management circuit comprising cascaded first and second E-Fuse switch circuits each having an input terminal and an output terminal, the input terminal of the first E-Fuse switch circuit configured to receive input power from an external power source responsive to connection of the data storage device to a host device, the output terminal of the first E-Fuse switch circuit coupled to both the input terminal and the output terminal of the second E-Fuse switch circuit via a conductive path configured to supply a rail voltage to the NVM, the second E-Fuse switch circuit configured to deactivate the first E-Fuse switch circuit responsive to a voltage at the output terminal of the first E-Fuse switch circuit falling below a predetermined threshold.

2. The data storage device of claim 1, wherein the first E-Fuse switch circuit comprises a first power switching device having a first forward voltage drop and the second E-Fuse switch circuit comprises a second power switching device having a second forward voltage drop higher than the first forward voltage drop, and wherein the first and second power switching devices are connected in series.

3. The data storage device of claim 1, wherein the first E-Fuse switch circuit comprises a first power switching device that is placed in a source-drain conductive state responsive to the voltage at the input terminal being at or above the predetermined threshold, and wherein the first power switching device is transitioned to a source-drain non-conductive state responsive to the voltage at the input terminal of the second E-Fuse switch circuit falling below the predetermined threshold.

4. The data storage device of claim 1, wherein the output terminal of the first E-Fuse switch circuit and the input and output terminals of the second E-Fuse switch circuit are further connected, via the conductive path, to a voltage converter circuit configured to output a second rail voltage lower than the rail voltage.

5. The data storage device of claim 1, further comprising a controller circuit configured to transfer data between the NVM and a host device, wherein the controller circuit initiates a back-up mode of operation to transfer data to the NVM in anticipation of a loss of input power responsive to the deactivation of the first E-Fuse switch circuit by the second E-Fuse switch circuit.

6. The data storage device of claim 5, wherein the second E-Fuse switch circuit further comprises a charging circuit configured to store charge on a capacitor connected to the second E-Fuse switch circuit, and a voltage regulator circuit configured to transfer the charge stored on the capacitor to the NVM and the controller circuit via the conductive path during the back-up mode of operation.

7. The data storage device of claim 1, further comprising a host interface connector having an input power terminal connected to the input terminal of the first E-Fuse switch circuit to receive the input power from the external power source.

8. The data storage device of claim 7, wherein the first E-Fuse switch circuit electrically isolates the input power terminal of the host interface connector with the conductive path that supplies a rail voltage to the NVM.

9. The data storage device of claim 1, wherein the first E-Fuse switch circuit is characterized as a load switch device and the second E-Fuse switch circuit is characterized as an energy storage and management device.

10. The data storage device of claim 1, characterized as a solid-state drive (SSD) card conforming to the M.2 Standard.

11. An energy management circuit for a data storage device, comprising:
a first E-Fuse switch circuit having a first input terminal, a first output terminal, and a first power switching device providing a first voltage drop between the first input terminal and the first output terminal; and
a second E-Fuse switch circuit having a second input terminal, a second output terminal, and a second power switching device providing a second voltage drop greater than the first voltage drop between the second input terminal and the second output terminal, the first output terminal connected to both the second input terminal and the second output terminal to bypass the second E-Fuse switch circuit during a normal operational mode, the second E-Fuse switch circuit configured to, during a backup mode, deactivate the first E-Fuse switch circuit responsive to a voltage at the second input terminal being below a predetermined threshold and output backup energy from the second output terminal.

12. The energy management circuit of claim 11, wherein the second E-Fuse switch circuit is configured to deactivate the first E-Fuse switch circuit by placing the first power switching device in a non-conductive state.

13. The energy management circuit of claim 11, further comprising a storage capacitor configured to store the backup energy.

14. The energy management circuit of claim 13 wherein the second E-Fuse switch circuit comprises a charging circuit configured to store charge on the storage capacitor responsive to application of a host voltage to the first input terminal, and a voltage regulator circuit configured to output the charge stored on the storage capacitor responsive to an absence of a host voltage at the first input terminal.

15. The energy management circuit of claim 11, in combination with a non-volatile memory (NVM), the energy management circuit further configured to supply electrical power to the NVM during the normal operational mode and during the backup mode.

16. A solid state drive (SSD) memory card, comprising:
a host interface connector;
a non-volatile memory (NVM) comprising flash memory;
a controller circuit configured to direct a transfer of user data between the NVM and a host device through the host interface connector;
a first E-Fuse switch circuit having a first input terminal, a first output terminal, and a first power switching device coupled between the first input terminal and the first output terminal, the first power switching device having a first forward voltage drop in a source-drain conductive state;
a second E-Fuse switch circuit having a second input terminal, a second output terminal, and a second power switching device coupled between the second input terminal and the second output terminal, the second power switching device having a second forward voltage drop in a source-drain conductive state higher than the first forward voltage drop;
the first input terminal coupled to the host interface connector to receive an input host voltage from the host device;
the first output terminal coupled to both the second input terminal and the second output terminal via a conductive path and configured to output a first output voltage to the controller circuit and the NVM during a normal mode having a magnitude determined responsive to the input host voltage and the first forward voltage drop; and the second E-Fuse switch circuit configured to, during a backup mode, deactivate the first E-Fuse switch circuit responsive to the first output voltage dropping below a predetermined threshold and output a second output voltage to the controller circuit and the NVM.

17. The SSD memory card of claim 16, further comprising a storage capacitor configured to store back-up energy during operation of the first and second E-Fuse switch circuits.

18. The SSD memory card of claim 17, wherein the second E-Fuse switch circuit comprises a charging circuit configured to store charge on the storage capacitor responsive to application of a host voltage to the first input terminal, and a voltage regulator circuit configured to output the charge stored on the storage capacitor responsive to an absence of a host voltage at the first input terminal.

19. The SSD memory card of claim 16, wherein second E-Fuse switch circuit further includes a power good terminal that provides a first voltage level responsive to the first output voltage being above the predetermined threshold and a second voltage level responsive to the first output voltage being below the predetermined threshold, the power good terminal connected to an enable terminal of the first E-Fuse switch circuit so that, as the voltage at the power good terminal transitions from the first level to the second level, the first E-Fuse switch circuit is transitioned from an enabled state to a disabled state.

20. The SSD memory card of claim 16, characterized as an M.2 SSD card.

* * * * *